US008916880B2

(12) United States Patent
Ohtsuka et al.

(10) Patent No.: US 8,916,880 B2
(45) Date of Patent: Dec. 23, 2014

(54) SILICON CARBIDE EPITAXIAL WAFER AND SEMICONDUCTOR DEVICE

(75) Inventors: Kenichi Ohtsuka, Tokyo (JP); Nobuyuki Tomita, Tokyo (JP); Tomoaki Furusho, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/808,382

(22) PCT Filed: Jul. 14, 2011

(86) PCT No.: PCT/JP2011/066062
§ 371 (c)(1),
(2), (4) Date: Jan. 4, 2013

(87) PCT Pub. No.: WO2012/026234
PCT Pub. Date: Mar. 1, 2012

(65) Prior Publication Data
US 2013/0099253 A1    Apr. 25, 2013

(30) Foreign Application Priority Data
Aug. 24, 2010  (JP) .................... 2010-186862

(51) Int. Cl.
*H01L 29/16* (2006.01)
*H01L 21/02* (2006.01)
*H01L 29/66* (2006.01)

(52) U.S. Cl.
CPC ...... *H01L 29/1608* (2013.01); *H01L 21/02447* (2013.01); *H01L 21/02529* (2013.01); *H01L 21/0262* (2013.01); *H01L 29/6606* (2013.01); *H01L 29/66068* (2013.01); *H01L 21/02507* (2013.01); *H01L 21/02573* (2013.01)
USPC ............... 257/77; 438/138; 438/478; 438/46; 438/648; 438/3

(58) Field of Classification Search
USPC ............... 257/77, 139, 330, 70, 335
See application file for complete search history.

(56) References Cited

U.S. PATENT DOCUMENTS 6,580,125 B2   6/2003   Kitabatake et al.
6,600,203 B2   7/2003   Takahashi et al.
(Continued)

FOREIGN PATENT DOCUMENTS

JP   6 268202      9/1994
JP   2000 319099   11/2000
JP   2002 329670   11/2002
(Continued)

OTHER PUBLICATIONS

International Search Report Issued Aug. 23, 2011 in PCT/JP11/66062 Filed Jul. 14, 2011.
(Continued)

*Primary Examiner* — Chuong A Luu
*Assistant Examiner* — Rodolfo Fortich
(74) *Attorney, Agent, or Firm* — Oblon, Spivak, McClelland, Maier & Neustadt, L.L.P.

(57) ABSTRACT

A semiconductor device that can suppress deterioration in crystal quality caused by a lattice mismatch between a substrate and an epitaxial layer and that also can ensure a voltage sustaining performance, and a wafer for forming the semiconductor device. An epitaxial wafer of silicon carbide (SiC), which is used for manufacturing a semiconductor device, includes a low resistance substrate and an epitaxial layer provided thereon. The epitaxial layer is doped with the same dopant as a dopant doped into the substrate, and has a laminated structure including a low concentration layer and an ultrathin high concentration layer. A doping concentration in the low concentration layer is lower than that in the silicon carbide substrate. A doping concentration in the ultrathin high concentration layer is equal to that in the silicon carbide substrate.

6 Claims, 9 Drawing Sheets

(56) References Cited

U.S. PATENT DOCUMENTS

2002/0158251 A1* 10/2002 Takahashi et al. .............. 257/70
2004/0041225 A1    3/2004 Nemoto
2009/0050932 A1*  2/2009 Lu et al. ........................ 257/139

FOREIGN PATENT DOCUMENTS

| | | |
|---|---|---|
| JP | 2003 318412 | 11/2003 |
| JP | 2008 74661 | 4/2008 |
| WO | 02 43157 | 5/2002 |

OTHER PUBLICATIONS

International Preliminary Report on Patentability and Written Opinion issued Mar. 28, 2013, in International Application No. PCT/JP2011/066062 (with English translation).

* cited by examiner

F I G. 4
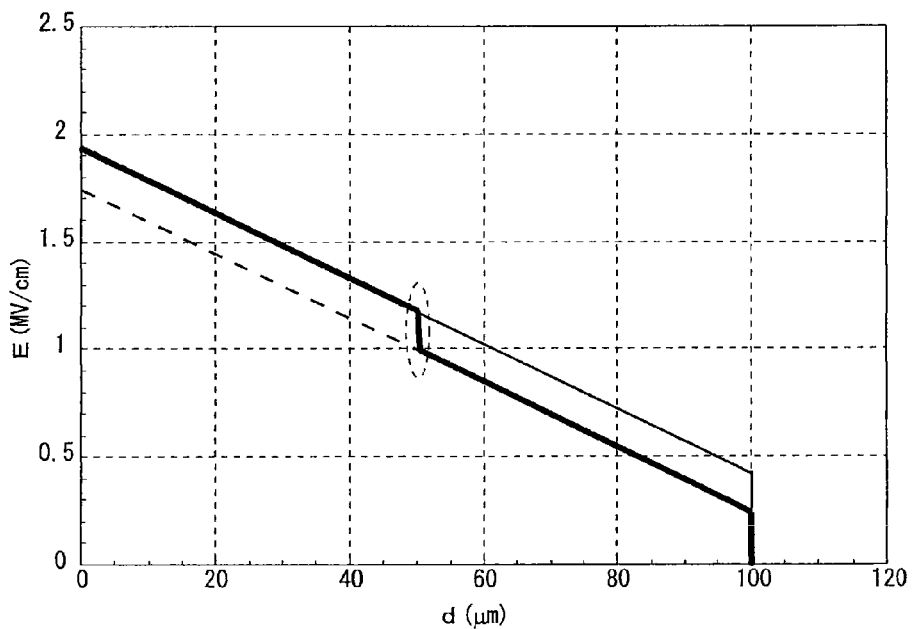
F I G. 5
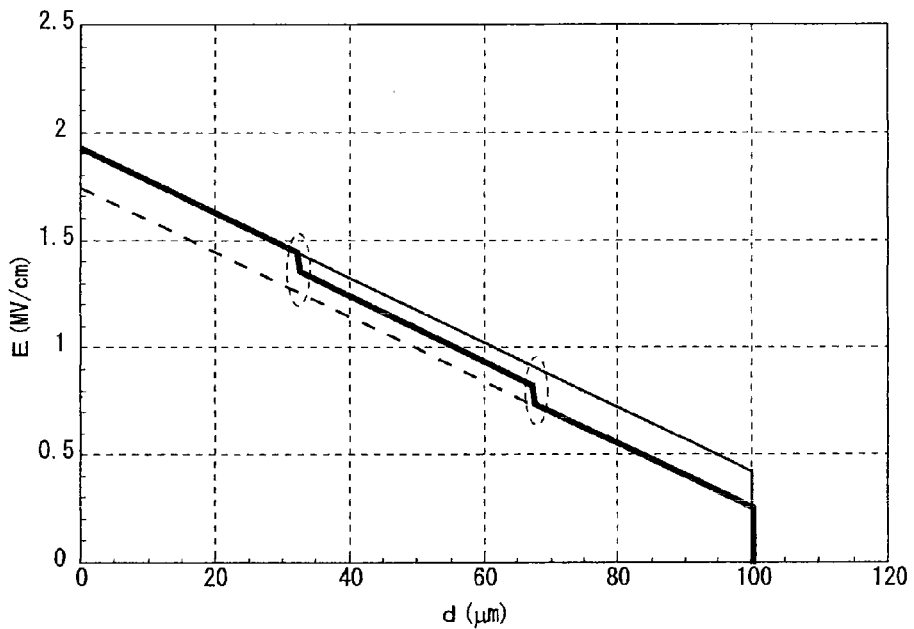

F I G . 8
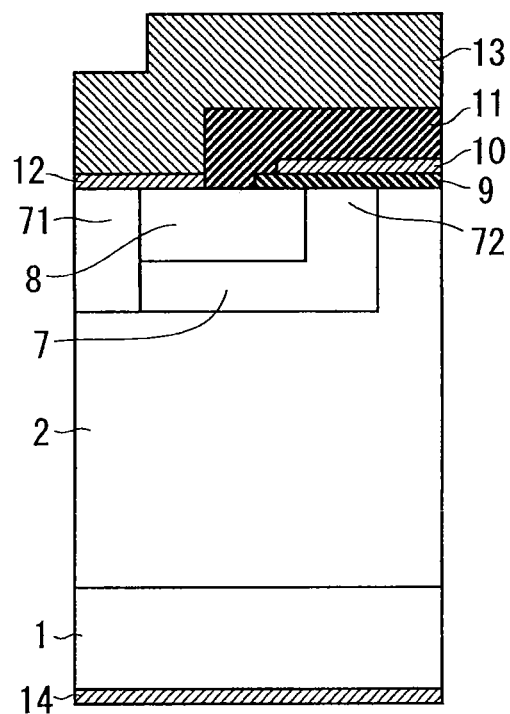

F I G . 1 1
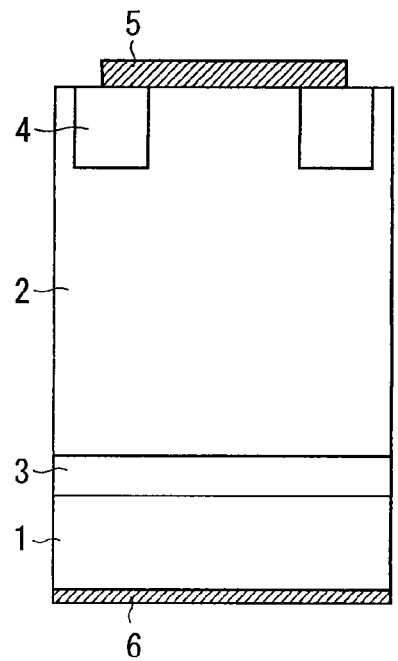
F I G . 1 2
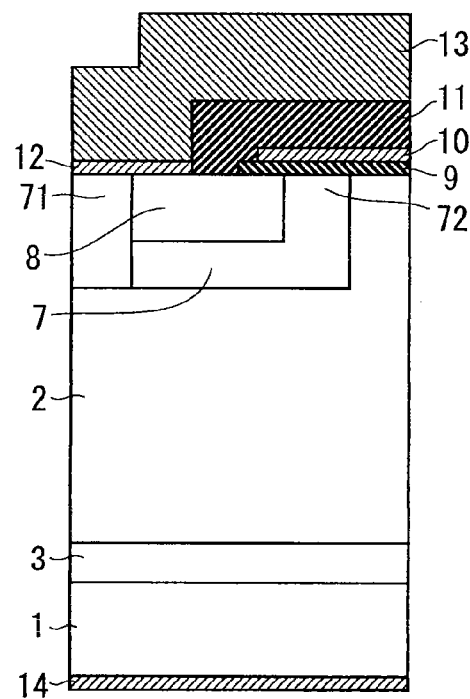

SILICON CARBIDE EPITAXIAL WAFER AND SEMICONDUCTOR DEVICE

TECHNICAL FIELD

The present invention relates to an epitaxial wafer including a semiconductor substrate and an epitaxial layer grown thereon, and to a configuration of a semiconductor device formed with the same.

BACKGROUND ART

A semiconductor element including a silicon carbide (SiC) semiconductor is attracting attention as a device that can achieve a high breakdown voltage and a low loss. As a structure thereof, a structure in which an epitaxial layer formed on a substrate having a low resistance (high doping concentration) acts as an operating layer is widely known. Particularly, in a semiconductor element (power device) for power, an epitaxial layer functions as a voltage sustaining layer (drift layer). Conventionally, a single layer structure has been generally used for the epitaxial layer (for example, Patent Document 1).

The epitaxial layer serving as a voltage sustaining layer of a power device ordinarily has a thickness of about 3 μm to 100 μm. However, depending on an operating voltage (the highest voltage assumed to be applied to the device; hereinafter also referred to as "assumed voltage"), the thickness may be set higher. In many cases, a doping concentration of an impurity (dopant) in the epitaxial layer is at most on the order of about $10^{16}$/cm$^3$. However, depending on the operating voltage, it may be set on or below the order of $10^{15}$/cm$^3$.

On the other hand, in a low resistance crystal that is a substrate, a dopant is often doped at a high concentration of $10^{19}$/cm$^3$ or therearound. Therefore, the doping concentrations in the substrate and in the epitaxial layer are largely different. Since the doping concentration influences a crystal lattice constant, the lattice constants of the substrate and the epitaxial layer are largely different. This difference in the lattice constant (lattice mismatch) is a factor that causes a crystal defect, and thus deteriorates the crystal quality of the epitaxial layer particularly when the epitaxial layer has a large thickness. Deterioration in the crystal quality of the epitaxial layer causes a problem that the mobility of carriers decreases and an element resistance increases.

One known method for solving this problem adopts a technique in which a buffer layer having an intermediate doping concentration is interposed between a substrate having a high doping concentration and an epitaxial layer having a low doping concentration. For example, Patent Document 2 discloses that a buffer layer having a doping concentration of $2 \times 10^{15}$ to $3 \times 10^{19}$/cm$^3$ and a thickness of 0.3 to 15 μm is provided to (11-20)-plane SiC crystal. Patent Document 2 also discloses, as a structure of the buffer layer, a single layer structure having a uniform doping concentration, a stepwise graded structure in which the doping concentration is varied stepwise in the thickness direction of the buffer layer, and a continuous graded structure in which the doping concentration is varied continuously in the thickness direction of the buffer layer.

Patent Document 3 discloses a buffer layer that is provided to a (0001)-plane or (000-1)-plane SiC crystal. In an example shown in Patent Document 3, for the purpose of suppressing introduction of basal plane dislocation into an epitaxial layer, the doping concentration of the buffer layer is set to be 1/10 to 1/2 of the doping concentration of a base layer, and a distribution of such a doping concentration has a stepwise graded structure.

Moreover, Patent Document 4 discloses a technique in which a high doping concentration layer is formed in a part of a drift layer in order to suppress an influence of a defect contained in a substrate given to the drift layer. Patent Document 5 shows a technique in which, in a drift layer of a field effect transistor, a high doping concentration layer is formed in a portion serving as a channel region and in a portion located at the n region side of the pn junction.

PRIOR-ART DOCUMENTS

Patent Documents

Patent Document 1: Japanese Patent Application Laid-Open No. 6-268202
Patent Document 2: Japanese Patent Application Laid-Open No. 2000-319099
Patent Document 3: Japanese Patent Application Laid-Open No. 2008-74661
Patent Document 4: Japanese Patent Application Laid-Open No. 2002-329670
Patent Document 5: International Publication WO 02/43157

SUMMARY OF THE INVENTION

Problems to be Solved by the Invention

Interposing the buffer layer between the substrate and the epitaxial layer (drift layer) as disclosed in Patent Documents 1 to 3 can reduce deterioration in the crystal quality caused by a lattice mismatch between the substrate and the epitaxial layer. When the buffer layer is thick, the effect is enhanced but the element resistance increases. This is not preferable, particularly for a power device. Therefore, a technique is demanded that achieves improvement in the crystal quality without use of a buffer layer or with use of a thin buffer layer.

On the other hand, introducing the high doping concentration layer into the drift layer as disclosed in Patent Documents 4 and 5 reduces the voltage sustaining performance of the drift layer. Particularly in a power device, it is important to ensure the voltage sustaining performance. Therefore, a technique is demanded that enables suitable setting of the thickness and doping concentration of the high doping concentration layer. In order to enhance the voltage sustaining performance of a power device, the thickness of the drift layer is increased. However, this is not preferable because the above-mentioned problem of the deterioration in the crystal quality is likely to occur and additionally the element resistance increases.

The present invention has been made to solve the problems described above, and an object of the present invention is to provide a semiconductor device that can suppress deterioration in the crystal quality caused by a lattice mismatch between a substrate and an epitaxial layer and that also can ensure a sufficient voltage sustaining performance, and to provide a wafer for forming the semiconductor device.

Means for Solving the Problems

An epitaxial wafer according to the present invention includes: a semiconductor substrate; and an epitaxial layer provided on the semiconductor substrate, the epitaxial layer being doped with the same dopant as a dopant doped into the semiconductor substrate and including a plurality of low concentration layers and at least one high concentration layer. A doping concentration of the dopant in the plurality of low concentration layers is lower than that in the semiconductor substrate. The at least one high concentration layer is arranged between the low concentration layers, and the thickness of the at least one high concentration layer is smaller than that of the low concentration layer, and a doping concentration of the dopant in the at least one high concentration layer is equal to that in the semiconductor substrate.

A semiconductor device according to the present invention includes: a semiconductor substrate; and a drift layer provided on the semiconductor substrate and including an epitaxial layer, the drift layer being doped with the same dopant as a dopant doped into the semiconductor substrate and including a plurality of low concentration layers and at least one high concentration layer. A doping concentration of the dopant in the plurality of low concentration layers is lower than that in the semiconductor substrate. The at least one high concentration layer is arranged between the low concentration layers, and the thickness of the at least one high concentration layer is smaller than that of the low concentration layer, and a doping concentration of the dopant in the at least one high concentration layer is equal to that in the semiconductor substrate.

Effects of the Invention

An influence of a lattice constant difference between the semiconductor substrate and the epitaxial layer is mitigated, and occurrence of a crystal defect is suppressed. Even when a crystal defect occurs, deterioration in the crystal quality of the epitaxial layer due to the crystal defect is suppressed. This prevents decrease in the mobility of carriers in the drift layer 2. Thus, a semiconductor device having a low element resistance is achieved.

BRIEF DESCRIPTION OF THE DRAWINGS

FIG. 4 A diagram showing an electric field distribution in a drift layer of the semiconductor device according to the present invention (in a case where the number of ultrathin high concentration layers is one).

FIG. 5 A diagram showing an electric field distribution in a drift layer of the semiconductor device according to the present invention (in a case where the number of ultrathin high concentration layers is two).

FIG. 8 A diagram showing a configuration of a field effect transistor that is a semiconductor device according to an embodiment 2.

FIG. 11 A diagram showing a configuration of a Schottky diode that is an example of a semiconductor device according to the embodiment 3.

FIG. 12 A diagram showing a configuration of a field effect transistor that is another example of the semiconductor device according to the embodiment 3.

EMBODIMENT FOR CARRYING OUT THE INVENTION

Embodiment 1

Figure 1:
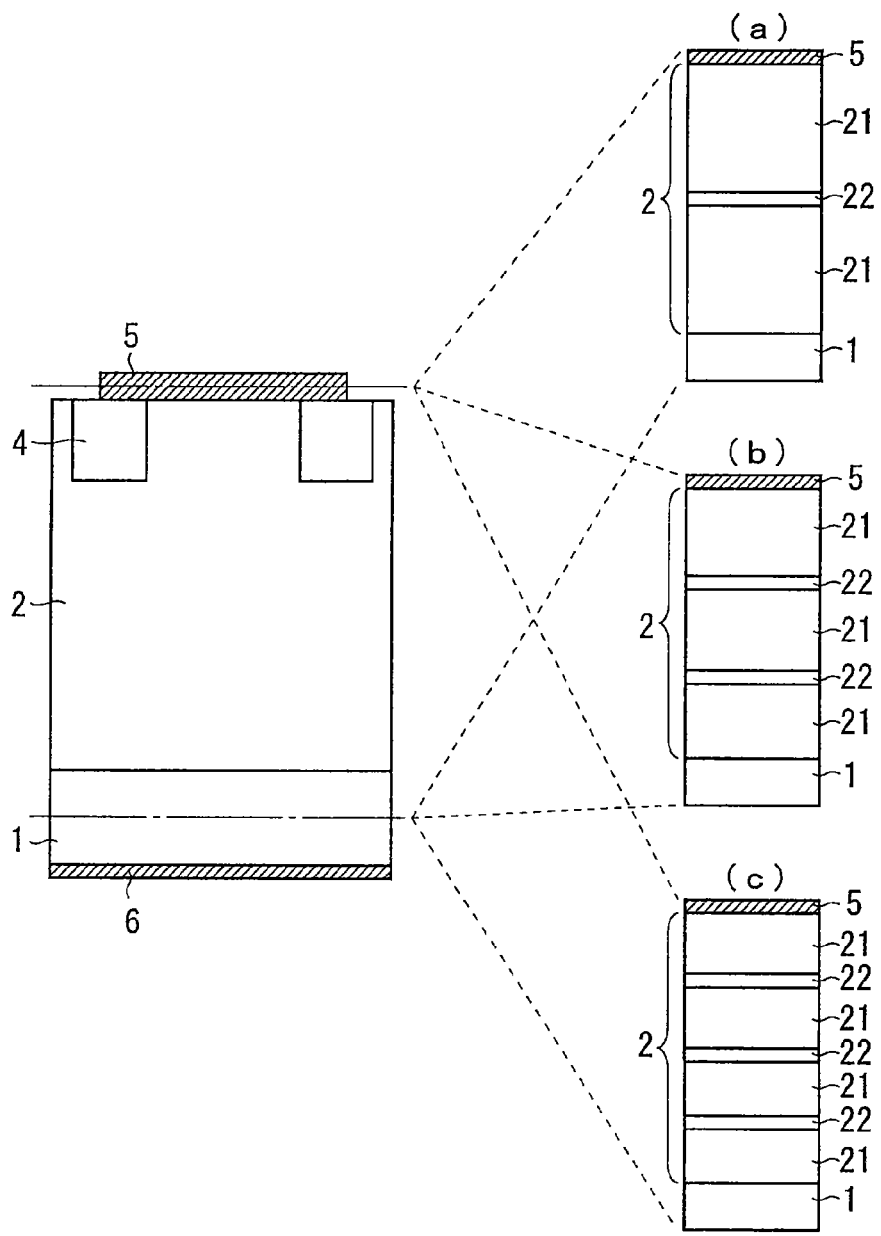
FIG. 1 A diagram showing a configuration of a Schottky diode that is a semiconductor device according to an embodiment 1.

FIG. 1 is a diagram showing a configuration of a semiconductor device according to an embodiment 1 of the present invention, and illustrates a Schottky diode as an example. The parts (a) to (c) shown at the right in FIG. 1 indicate configurations of a drift layer (epitaxial layer) of the semiconductor device.

As shown in FIG. 1, the Schottky diode of this embodiment includes a substrate 1, a drift layer 2, a guard ring 4, an anode electrode 5, and a cathode electrode 6. The substrate 1 is a low resistance SiC substrate doped with an n-type dopant at a high concentration. In order to suppress the element resistance, it is desirable that the resistivity of the substrate 1 is as low as possible. Thus, a group-V element (such as nitrogen) is doped at a high concentration. However, when the doping concentration is excessively high, a crystal defect is likely to occur. Accordingly, the doping concentration is ordinarily set to be $10^{19}/cm^3$ and therearound, for example, to be about $7\times10^{18}/cm^3$ to $3\times10^{19}/cm^3$.

The drift layer 2 is configured as a SiC epitaxial layer that is grown on the substrate 1. The drift layer 2 is doped with the same dopant as the dopant doped into the substrate 1. The drift layer 2 has a laminated structure including a plurality of low concentration layers 21 and at least one high concentration layer 22. The doping concentration of the low concentration layers 21 is lower than that of the substrate 1. The at least one high concentration layer 22 is interposed between the low concentration layers 21, and is doped with the aforementioned dopant at the doping concentration equal to that of the substrate 1.

The low concentration layer 21 acts mainly to hold a voltage, and is formed relatively thick. The high concentration layer 22 acts mainly to suppress occurrence of a defect due to a lattice constant difference between the substrate 1 and the drift layer 2. The high concentration layer 22 is formed extremely thin as compared with the low concentration layer 21. Hereinafter, the high concentration layer 22 will be referred to as "ultrathin high concentration layer 22". In FIG. 1, the part (a) schematically shows a configuration in which the drift layer 2 includes one ultrathin high concentration layer 22, the part (b) schematically shows a configuration in which the drift layer 2 includes two ultrathin high concentration layers 22, and the part (c) schematically shows a configuration in which the drift layer 2 includes three ultrathin high concentration layers 22. The number of ultrathin high concentration layers 22 may be four or more.

While the thickness of the ultrathin high concentration layer 22 will be described later, the thickness of the entire drift layer 2 (including both the low concentration layers 21 and the ultrathin high concentration layer 22) is determined in accordance with a breakdown voltage required in a power device, and ordinarily is about 3 to 150 μm. As described above, the doping concentration of the ultrathin high concentration layer 22 is equal to that of the substrate 1. On the other hand, the doping concentration of the low concentration layer 21 is determined in accordance with a necessary breakdown voltage, and ordinarily is about $0.5 \times 10^{15}$ to $20 \times 10^{15}$/cm$^3$.

The anode electrode 5 is formed on an upper surface of the drift layer 2, and a cathode electrode 6 is formed on a lower surface of the substrate 1. In an upper portion of the drift layer 2, the guard ring 4 that is a p-type region is formed near an end portion of the anode electrode 5. The guard ring 4 functions as a termination structure for mitigating an electric field concentration in the vicinity of the end portion of the anode electrode 5.

The guard ring 4 is formed by selectively ion-implanting a p-type dopant into the upper portion of the drift layer 2 and then activating it through a heat treatment. The thickness of the guard ring 4 is about 0.5 to 2 μm, and the doping concentration of the p-type dopant is about $10^{17}$ to $100 \times 10^{17}$/cm$^3$.

The anode electrode 5 is in Schottky contact with the drift layer 2 (n-type region), and may be either in Schottky contact or in ohmic contact with the guard ring 4. In order that the anode electrode 5 and the guard ring 4 are in ohmic contact with each other, the contact resistance between them is set to be $10^{-3}$ Ω·cm$^2$ or less. In this case, a rise in the on-voltage caused by a current flowing in a contact portion can be reduced. When the contact resistance is set to $10^{-4}$ Ω·cm$^2$ or less, a rise in the on-voltage caused by an influence of the contact portion between the anode electrode 5 and the guard ring 4 can be suppressed to a negligible level.

As shown in FIG. 1, the drift layer 2 of the Schottky diode according to this embodiment has a laminated structure in which the ultrathin high concentration layer 22 doped with the same dopant as that of the substrate 1 at the same concentration as that of the substrate 1 is interposed between the low concentration layers 21. This structure can mitigate an influence of the lattice constant difference between the substrate 1 and the drift layer 2 (low concentration layer 21), thus suppressing occurrence of a crystal defect. Even when a crystal defect occurs, deterioration in the crystal quality of the drift layer 2 due to the crystal defect is suppressed. This prevents decrease in the mobility of carriers in the drift layer 2. Thus, a semiconductor device having a low element resistance is achieved.

Figure 2:
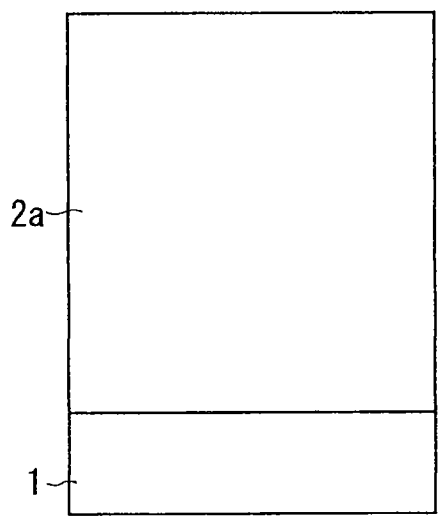
FIG. 2 A diagram showing a configuration of an epitaxial wafer according to an embodiment 1.

FIG. 2 shows an epitaxial wafer 100 that is used for the formation of the Schottky diode according to this embodiment. The epitaxial wafer 100 includes the substrate 1 and an epitaxial layer 2a formed thereon. The epitaxial layer 2a is used as the drift layer 2 of the Schottky diode. The epitaxial layer 2a of FIG. 2 has, though not shown, a laminated structure made up of the low concentration layer 21 and the ultrathin high concentration layer 22 as shown in the parts (a) to (c) of FIG. 1. A method for forming each component of the Schottky diode may be similar to the conventional method, and therefore a description thereof is omitted herein.

The thickness of the ultrathin high concentration layer 22 provided in the drift layer 2 will be discussed below. When the doping concentration in the drift layer 2 increases, the breakdown voltage of the drift layer 2 drops. Therefore, it is necessary that the thickness of the ultrathin high concentration layer 22 is reduced so as to ensure a voltage sustaining performance that is required in a device.

Figure 3:
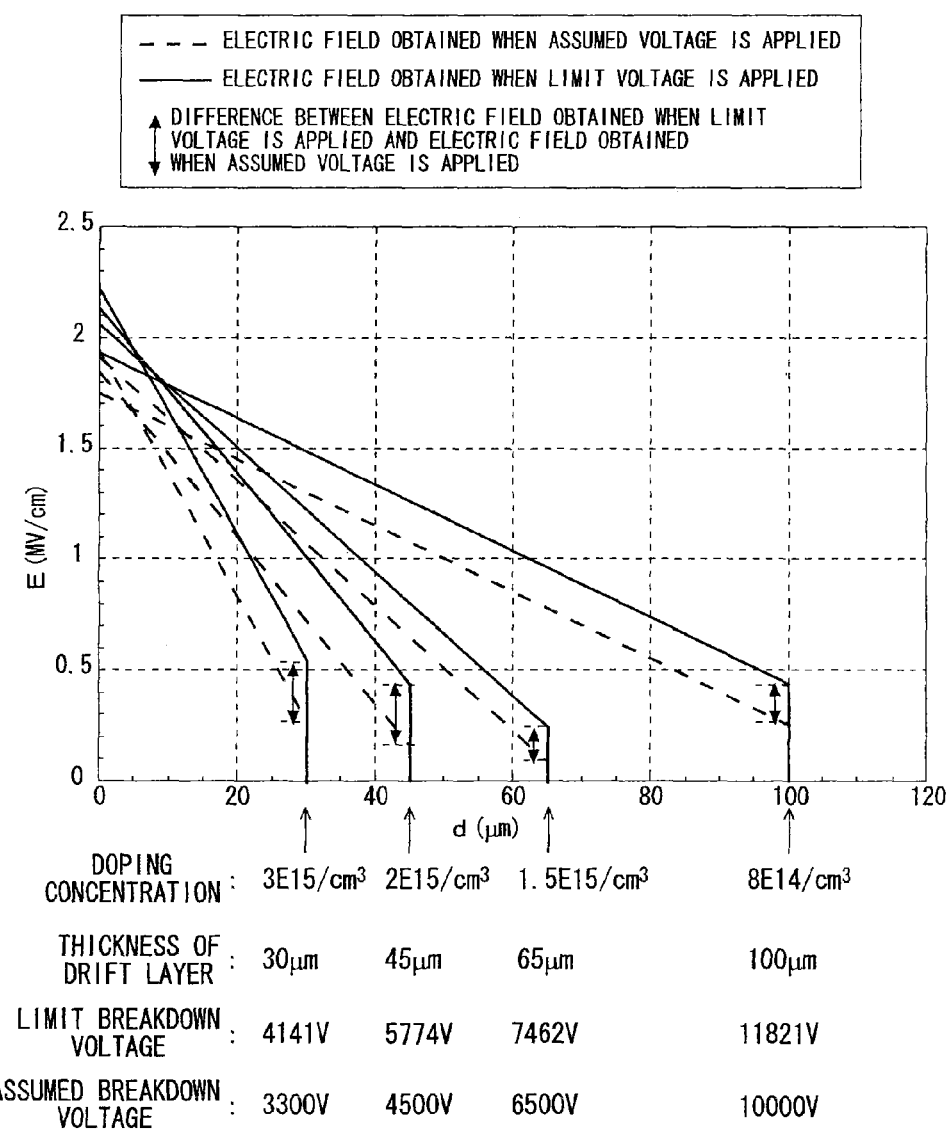
FIG. 3 A diagram showing an electric field distribution in a drift layer of a conventional semiconductor device.

FIG. 3 is a diagram showing an electric field distribution in a drift layer of a conventional semiconductor device. In the graphs shown in FIG. 3, the horizontal axis represents a distance (depth) d [μm] from an upper surface of the drift layer, and the vertical axis represents the electric field intensity E [MV/cm] in the drift layer.

Herein, the cases where the highest voltage assumed to be applied to the device (hereinafter referred to as "assumed voltage") are 3300V, 4500V, 6500V, and 10000V are considered, and examples the respective drift layers corresponding to the cases are shown.

In the device whose assumed breakdown voltage is 3300V, the drift layer is set to have a doping concentration of $3 \times 10^{15}$/cm$^3$ and a thickness of 30 μm. In the device whose assumed breakdown voltage is 4500V, the drift layer is set to have a doping concentration of 2×1015/cm3 and a thickness of 45 μm. In the device whose assumed breakdown voltage is 6500V, the drift layer is set to have a doping concentration of $1.5 \times 10^{15}$/cm$^3$ and a thickness of 65 m. In the device whose assumed breakdown voltage is 10000V, the drift layer is set to have a doping concentration of $8 \times 10^{14}$/cm$^3$ and a thickness of 100 μm.

In FIG. 3, each broken-line graph shows an electric field distribution in the drift layer obtained in a case where the assumed voltage is applied to the drift layer. Each solid-line graph shows an electric field distribution in the drift layer obtained in a case where the highest voltage that can be held by the layer (hereinafter referred to as "limit voltage") is applied. Here, as the limit voltage of the drift layer, an avalanche breakdown voltage calculated for a drift layer in an ideal device having no end (with an infinite width) is set. A value obtained by integrating the electric field intensity of each graph with respect to the thickness of the drift layer, that is, the area of a polygonal shape defined by the graph, the vertical axis, and the horizontal axis, corresponds to the voltage held by the drift layer.

In FIG. 3, an interface between the substrate and the drift layer corresponds to the position of d=30 μm when the assumed breakdown voltage is 3300V, the position of d=45 μm when the assumed breakdown voltage is 4500V, the position of d=65 μm when the assumed breakdown voltage is 500V, and the position of d=100 μm when the assumed breakdown voltage is 10000V. As seen from FIG. 3, in any of the conventional devices, an electric field value at the interface between the substrate and the drift layer obtained when the limit voltage is applied is about 0.3 to 0.6 MV/cm. It is also seen that, in any of the devices, a difference between the electric field value obtained when the assumed voltage is applied and the electric field value obtained when the limit voltage is applied at the interface between the substrate and the drift layer is about 0.2 to 0.3 MV/cm.

FIGS. 4 and 5 are diagrams showing an electric field distribution in the drift layer 2 (epitaxial layer) of the semiconductor device according to the present invention. Here, a device whose assumed breakdown voltage is 10000V is considered, in which the thickness of the drift layer 2 (including both the low concentration layers 21 and the ultrathin high concentration layer 22) is 100 μm which is equal to that of the conventional device and the doping concentration in the low concentration layer 21 of the drift layer 2 is $8 \times 10^{14}$/cm$^3$ which is equal to that of the conventional device. In FIGS. 4 and 5, the thin-solid-line graph and the broken-line graph show the electric field distribution in the drift layer of the conventional device shown in FIG. 3 whose assumed breakdown voltage is 10000V.

In FIG. 4, the thick-line graph shows an electric field distribution in the drift layer 2 including one ultrathin high concentration layer 22, obtained in a case where the limit voltage is applied. The ultrathin high concentration layer 22 is provided at a position of about 50 μm from an upper surface of the drift layer 2 (the position in the ellipse indicated by the dotted line in FIG. 4). It is seen that a slope of change of the electric field intensity becomes greater locally in a portion where the ultrathin high concentration layer 22 is provided.

In FIG. 5, the thick-line graph shows an electric field distribution in the drift layer 2 including two ultrathin high concentration layers 22, obtained in a case where the limit voltage is applied. The ultrathin high concentration layers 22 are provided at positions of about 33 µm and about 67 µm from an upper surface of the drift layer 2 (the positions in the ellipses indicated by the dotted lines in FIG. 5). In this case, too, it is seen that a slope of change of the electric field intensity becomes greater locally in portions where the ultrathin high concentration layer 22 is provided.

Thus, in the drift layer 2 according to the present invention, the slope of change of the electric field intensity becomes greater locally in the portion where the ultrathin high concentration layer 22 is provided. As a result, as compared with the conventional drift layer, a voltage that can be held (corresponding to the area of a polygonal shape defined by the graph, the vertical axis, and the horizontal axis) is smaller. Therefore, it is necessary to reduce the thickness of the ultrathin high concentration layer 22 (in a case where a plurality of ultrathin high concentration layers 22 are provided, the total sum of their thicknesses), in order to avoid a large reduction in the breakdown voltage of the device.

When the total sum of thicknesses of the ultrathin high concentration layers 22 is defined as w (nm) and the doping concentration is defined as N (/cm$^3$) (which is equal to the doping concentration in the substrate 1), the amount of change ΔE (MV/cm) of the electric field intensity occurring in the ultrathin high concentration layer 22 is expressed as $$\Delta E = qNw/\in \quad (1)$$

In Expression (1), ∈ represents the dielectric constant of the drift layer, and q represents the charge quantity of electrons.

In FIGS. 4 and 5, ΔE is set equal to a difference between the electric field value obtained when the assumed voltage is applied and the electric field value obtained when the limit voltage is applied in the conventional drift layer. The term "conventional drift layer" referred to herein means a drift layer having a single layer structure (not including the ultrathin high concentration layer 22) whose thickness is equal to that of the drift layer 2 of the present invention and whose doping concentration is equal to that of the low concentration layer 21 of the present invention.

For example, in FIG. 4, the thick-line graph is substantially coincident with the thin-solid-line graph in a region of the drift layer 2 with a depth less than about 50 µm, while the thick-line graph is substantially coincident with the broken-line graph in a region with a depth more than about 50 µm. In this case, although a difference between the assumed voltage and the limit voltage is about half that of the conventional drift layer, the assumed breakdown voltage can be sufficiently ensured.

In FIG. 5, the thick-line graph is substantially coincident with the thin-solid-line graph in a region of the drift layer 2 with a depth less than about 33 µm. In a region with a depth of about 33 µm to about 66 µm, the thick-line graph passes between the thin-solid-line graph and the broken-line graph. In a region with a depth more than about 66 µm, the thick-line graph is substantially coincident with the broken-line graph. Although in this case, too, a difference between the assumed voltage and the limit voltage is about half that of the conventional drift layer, the assumed breakdown voltage can be sufficiently ensured.

As described above, in the drift layer 2 according to the present invention, the assumed breakdown voltage can be sufficiently ensured, if the amount of change ΔE of the electric field intensity occurring in the ultrathin high concentration layer 22 is suppressed down to about 0.2 to 0.3 MV/cm which is equal to the difference between the electric field value obtained when the assumed voltage is applied and the electric field value obtained when the limit voltage is applied in the conventional drift layer.

Furthermore, even if ΔE is increased up to about 0.3 to 0.6 MV/cm which is equal to the electric field value obtained at the interface with the substrate when the limit voltage is applied in the conventional drift layer, the limit voltage that is substantially close to the assumed voltage is obtained. Therefore, the assumed breakdown voltage can be substantially ensured.

Figure 6:
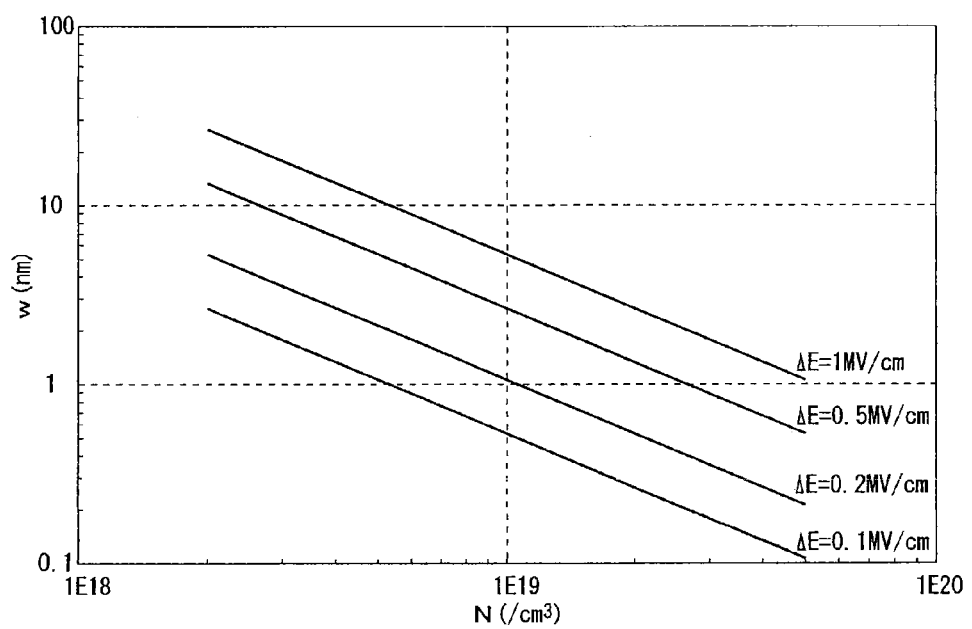
FIG. 6 A diagram showing the relationship between the amount of change of the electric field relative to the doping concentration and thickness of the ultrathin high concentration layer in the drift layer of the semiconductor device according to the present invention.

FIG. 6 shows graphs obtained based on Expression (1), which shows the relationship of the amount of change ΔE [MV/cm] of the electric field relative to the doping concentration N [/cm$^3$] and the total sum w [nm] of thicknesses of the ultrathin high concentration layers 22 in the drift layer 2 according to the present invention. Since the doping concentration in the ultrathin high concentration layer 22 is equal to that in the substrate 1, FIG. 6 shows a range of $10^{19}$/cm$^3$ and therearound, which is a range ordinarily adopted as the doping concentration in a SiC low resistance substrate.

In a case where the drift layer 2 is made of SiC (∈=9.66) as in this embodiment, the total amount of sheet concentration [/cm$^2$] of the dopant, which is represented by the product of the total sum w of thicknesses and the doping concentration N of the ultrathin high concentration layers 22, is expressed as $$w \cdot N = 5.346 \times 10^{12} \cdot \Delta E \quad (2)$$

based on Expression (1) (in Expressions (2) to (3), the unit of w is [cm]).

When an acceptable value of ΔE is defined as ΔE1, the breakdown voltage necessary for the drift layer is ensured if the conditions of $$w \cdot N \leq 5.346 \times 10^{12} \cdot \Delta E1 \quad (3)$$

is satisfied.

Assuming that the doping concentration in the substrate 1 is $10^{19}$/cm$^3$ and therearound, as seen from FIG. 6, the total sum w of thicknesses of the ultrathin high concentration layers 22 may be set to be about several nm in order to suppress the amount of change ΔE of the electric field occurring in the ultrathin high concentration layer 22 down to about 0.2 to 0.5 MV/cm, for example. Even in a case where a maximum acceptable value of ΔE is 1 MV/cm, it is necessary that the total sum w of thicknesses of the ultrathin high concentration layers 22 is 10 nm or less.

A specific calculation will be given based on Expression (3). In a case where the maximum acceptable value of ΔE is 1 MV/cm (ΔE1=1 MV/cm), the thickness of each ultrathin high concentration layer 22 is determined such that the total amount of sheet concentration of the dopant in the ultrathin high concentration layer 22 is $5.346 \times 10^{12}$/cm$^2$ or less. That is, in a case where the doping concentration in the substrate 1 is $10^{19}$/cm$^3$, and if the maximum acceptable value of ΔE is 1 MV/cm, the total sum w of thicknesses of the ultrathin high concentration layers 22 is set to be 5.3 nm or less. In the same manner, if the maximum acceptable value of ΔE is 0.5 MV/cm, the total sum w of thicknesses of the ultrathin high concentration layers 22 is set to be 2.6 nm or less. If the maximum acceptable value of ΔE is 0.3 MV/cm, the total sum w of thicknesses of the ultrathin high concentration layers 22 is set to be 1.6 nm or less.

In a case where the doping concentration in the substrate 1 is $7 \times 10^{18}$/cm$^3$, and if the maximum acceptable value of ΔE is 1 MV/cm, the total sum w of thicknesses of the ultrathin high concentration layers 22 is set to be 7.6 nm or less. In the same manner, if the maximum acceptable value of ΔE is 0.5

MV/cm, the total sum w of thicknesses of the ultrathin high concentration layers 22 is set to be 3.8 nm or less. If the maximum acceptable value of ΔE is 0.3 MV/cm, the total sum w of thicknesses of the ultrathin high concentration layers 22 is set to be 2.2 nm or less.

Here, a description will be given to a method for controlling the thickness of the ultrathin high concentration layer 22. The ultrathin high concentration layer 22 is formed in a stage where the epitaxial layer 2a of the epitaxial wafer 100 is grown as shown in FIG. 2. In a process of growing the epitaxial layer 2a, the amount of a gas containing a dopant (such as nitrogen) supplied during a period for the formation of the low concentration layer 21 (doping concentration is on the order of $10^{15}/cm^3$ to the order of $10^{14}/cm^3$) and the amount of the gas supplied during a period for the formation of the ultrathin high concentration layer 22 (doping concentration $10^{19}/cm^3$ and therearound) are made different from each other. Thereby, a laminated structure of the low concentration layer 21 and the ultrathin high concentration layer 22 is obtained.

However, since the growth rate of the SiC epitaxial layer 2a is ordinarily about 3 to 10 μm/hour, a time required for the growth of the ultrathin high concentration layer 22 with a thickness of 10 nm is about 3.6 to 12 seconds, which is a short time. Therefore, it is necessary to steeply change the amount of supply of a material gas containing a dopant. However, this is not sufficient to facilitate an accurate control of the doping concentration and thickness of the ultrathin high concentration layer 22. Accordingly, it is effective that various growth parameters other than the amount of supply of the material gas containing the dopant are also changed and the growth rate of the epitaxial layer 2a is simultaneously controlled.

Figure 7:
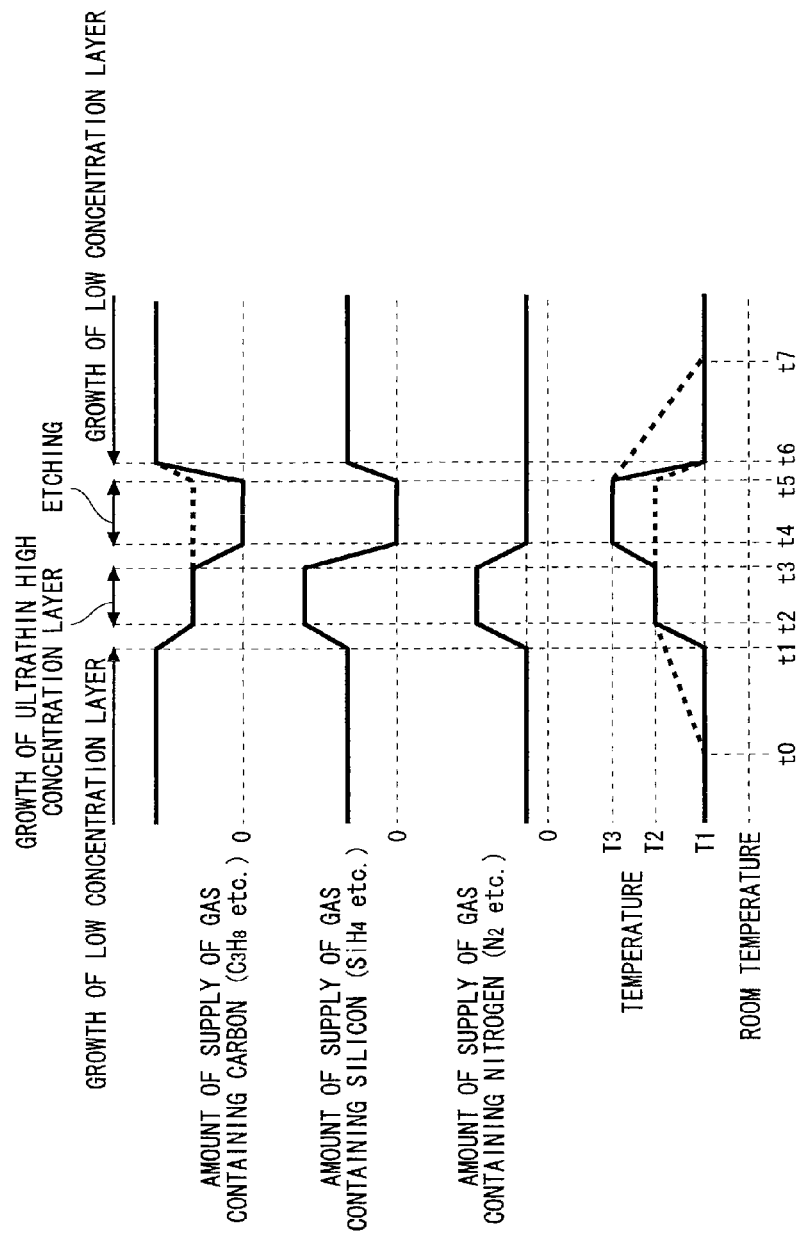
FIG. 7 A diagram for explaining a method for forming an epitaxial layer according to the present invention.

FIG. 7 is a diagram for explaining a method for forming the epitaxial layer 2a according to the present invention. Herein, as one example thereof, a case where nitrogen is adopted as the dopant and an n-type silicon carbide (SiC) is epitaxially grown will be described. In such a case, a gas (such as $SiH_4$) containing silicon and a gas (such as $C_3H_8$) containing carbon, which serve as the material gas, and a gas (such as $N_2$) containing nitrogen, which serves as the dopant, are supplied into a growth furnace. Moreover, hydrogen ($H_2$), which serves as an atmosphere gas, is supplied into the growth furnace, though not shown in FIG. 7.

Firstly, by an ordinary method, the low concentration layer 21 is grown on the substrate 1. When the low concentration layer 21 has reached a desired thickness (time t1), the amount of supply of the gas containing nitrogen is increased to form the ultrathin high concentration layer 22 (times t2 to t3). At this time, as compared with the period for the growth of the low concentration layer 21, the amount of supply of the gas containing carbon is decreased while the amount of supply of the gas containing silicon is increased. This is because decrease in the ratio of the gas containing carbon facilitates incorporation of nitrogen into a SiC crystal.

In period (times t2 to t3) for the growth of the ultrathin high concentration layer 22, the temperature in the growth furnace is raised to a temperature (T2) that is higher than a temperature (T1) in the period for the growth of the low concentration layer 21. Raising the growth temperature lowers the growth rate of the ultrathin high concentration layer 22 due to an etching effect exerted by hydrogen that is the atmosphere gas. This makes it easy to control the thickness of the ultrathin high concentration layer 22. Moreover, when the growth temperature is high, the incorporation of nitrogen into a SiC crystal is facilitated. This is also effective in the growth of the ultrathin high concentration layer 22.

After the ultrathin high concentration layer 22 is grown with a certain thickness (time t3), the supply of the gas containing silicon and the gas containing carbon, which serve as the material gas, is once stopped, if necessary (time t4 to t5). This can reduce the thickness of the grown ultrathin high concentration layer 22 due to an etching effect exerted by hydrogen that is the atmosphere gas. Taking advantage of this, a fine adjustment of the thickness of the ultrathin high concentration layer 22 is achieved. To facilitate the etching, the temperature in the growth furnace is raised to a further higher temperature (T3). At this time, the etching rate is low, about 5 to 20 nm/min. Therefore, the thickness of the ultrathin high concentration layer 22 can be adjusted with a high accuracy.

After the fine adjustment of the thickness of the ultrathin high concentration layer 22 is completed (time t5), the growth of the low concentration layer 21 is performed again by the ordinarily method (at and after time t6). Thereafter, the above-described steps are repeatedly performed in accordance with the number of ultrathin high concentration layers 22 to be provided.

In FIG. 7, the broken lines show modifications of the steps described above. For example, in the description given above, a temperature raise for suppressing the growth rate of the ultrathin high concentration layer 22 is performed after the low concentration layer 21 has reached a desired thickness (time t1). However, the temperature raise may be started earlier (time t0). Moreover, in the example shown in FIG. 7, the temperature is steeply lowered after the formation of the ultrathin high concentration layer 22 (times t5 to t6). However, the temperature may be gently lowered (times t5 to t7).

In the step of the fine adjustment of the thickness of the ultrathin high concentration layer 22 by utilizing the etching effect exerted by hydrogen (time t4 to t5), it suffices that the supply of at least one of the gas containing silicon and the gas containing carbon is stopped. For example, it is possible that, as indicated by the broken line in FIG. 7, only the gas containing silicon is stopped while the supply of the gas containing carbon is continued. Additionally, in this step, the temperature (T2) for the growth of the ultrathin high concentration layer 22 may be maintained as the temperature in the growth furnace. This involves a risk of an elongated time required for this step because the etching rate is lowered as compared with when the temperature is raised, but the adjustment of the thickness of the ultrathin high concentration layer 22 can be performed with a higher accuracy. By these techniques, the adjustment of the thickness of the ultrathin high concentration layer 22 can be performed with a high accuracy. However, there is a technical limit in the reduction in the thickness of the ultrathin high concentration layer 22. Therefore, in order to maintain a quality of the ultrathin high concentration layer 22, it is desirable to ensure a thickness of about at least 0.5 nm.

This embodiment illustrates the case where an epitaxial wafer and a semiconductor device are made of silicon carbide (SiC) that is a wide band-gap semiconductor. The present invention would be applicable also to an epitaxial wafer and a semiconductor device are made of a semiconductor whose band-gap is comparable to that of SiC. Examples of another wide band-gap semiconductor include a gallium nitride material and zinc oxide.

Embodiment 2

In an embodiment 2, a case where the present invention is applied to a field effect transistor is illustrated. FIG. 8 is a diagram showing a configuration of a field effect transistor that is a semiconductor element according to the embodiment 2. This field effect transistor is, similarly to the embodiment 1, formed with use of the epitaxial wafer 100 that includes the n-type SiC low resistance substrate 1 and the n-type SiC epitaxial layer 2a having the low concentration layer 21 and the ultrathin high concentration layer 22. The epitaxial layer 2a functions as the drift layer 2 of the field effect transistor.

As shown in FIG. 8, the field effect transistor includes the substrate 1, the drift layer 2, a body region 7, a source region 8, a gate insulating film 9, a gate electrode 10, an interlayer insulating film 11, a source electrode 12, a interconnection 13, and a drain electrode 14. The drift layer 2 (epitaxial layer) provided on the substrate 1, similarly to the one illustrated in the parts (a) to (c) of FIG. 1, has a laminated structure including the low concentration layer 21 whose doping concentration is lower than that of the substrate 1 and the ultrathin high concentration layer 22 doped with the same dopant as that of the substrate 1 at the same concentration as that of the substrate 1.

The body region 7 is a p-type region formed in an upper portion of the drift layer 2. The source region 8 is an n-type region formed in an upper portion of the body region 7. Each of the body region 7 and the source region 8 is formed by selectively ion-implanting a dopant to the drift layer 2 and activating the dopant through a heat treatment. The body region 7 has a thickness of about 0.5 to 2 μm, and a doping concentration of about $3 \times 10^{17}$ to $20 \times 10^{17}/cm^3$. The source region 8 has a thickness of about 0.3 to 1 μm, and a doping concentration of about $5 \times 10^{18}$ to $50 \times 10^{18}/cm^3$. The heat treatments for the activation of respective ion implantation species may be collectively performed, or each of the heat treatments is performed in each corresponding implantation step.

The gate insulating film 9 is provided on the upper surface of the drift layer 2 so as to extend over the source region 8, the body region 7, and the n-type region of the drift layer 2. The gate insulating film 9 has a film thickness of 10 to 100 nm. A silicon oxide film, a silicon oxynitride film, or the like, is adoptable therefor. Examples of a method for forming the gate insulating film 9 include causing thermal oxidation or nitridation of the upper surface of the drift layer 2 (epitaxial layer), forming an insulating film through deposition, and combinations thereof.

The gate electrode 10 is formed on the gate insulating film 9 so as to extend over the source region 8, the body region 7, and the n-type region of the drift layer 2. A channel (hereinafter, this portion will be referred to as "channel formation region 72") is formed in a superficial portion 72 of the body region 7 located below the gate electrode 10. The gate electrode 10 is formed by forming a polycrystal silicon film or a metal film by deposition and performing a patterning.

The interlayer insulating film 11 is formed on the gate electrode 10. The interlayer insulating film 11 has an opening (contact hole) that reaches an upper surface of the source region 8. In this opening, the upper surface of the source region 8 is exposed, and the source electrode 12 is formed on the exposed upper surface. As shown in FIG. 8, the source electrode 12 is formed so as to be connected not only to the source region 8 but also to a part of the body region 7 (hereinafter, a portion of the body region 7 to which the source electrode 12 is connected will be referred to as "contact region 71").

The interconnection 13 connected to the source electrode 12 is formed on the interlayer insulating film 11. The interlayer insulating film 11 and the interconnection 13 are removed in a region (normally, an outer peripheral portion of the element) where a pad of the gate electrode 10 is formed, though not shown. The drain electrode 14 is formed on a back surface of the substrate 1.

A most superficial portion of the body region 7, which serves as the channel formation region 72 (or which is adjacent to the channel formation region 72), may have a lower doping concentration than that of the other portions. In this portion, diffusion of the impurity is reduced, which increases the mobility of carriers in the channel. Thus, the element resistance can be reduced.

On the other hand, as for a most superficial portion of the contact region 71 of the body region 7, it is possible that a high concentration doping may be separately performed only therein, in order to obtain a higher doping concentration (about $5 \times 10^{18}$ to $50 \times 10^{18}/cm^3$). In such a case, the resistance of connection between the source electrode 12 and the contact region 71 can be reduced.

Figure 9:
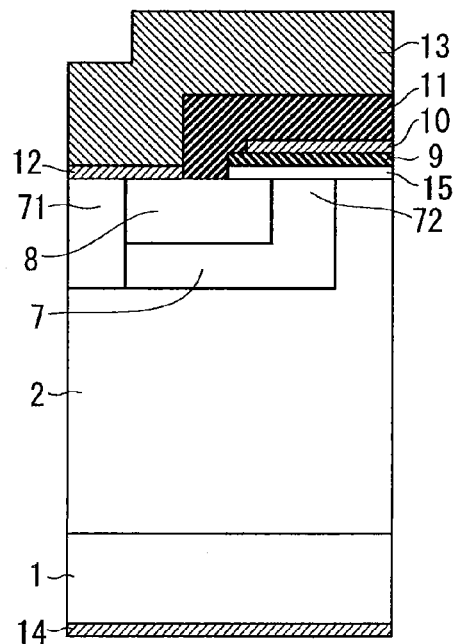
FIG. 9 A diagram showing a modification of the field effect transistor according to the embodiment 2.

As shown in FIG. 9, a SiC channel layer 15 may be provided between the gate insulating film 9 and the upper surfaces of the source region 8, the body region 7, and the drift layer 2. The conductive type of the channel layer 15 may be either of n-type and p-type. If there is a need to reform the roughened surface of the drift layer 2 caused as a result of the heat treatment performed for the activation of the ion implantation species, it is desirable that the channel layer 15 is formed by being epitaxially grown on an upper layer of the drift layer 2. If there is not such a need, the channel layer 15 may be formed by performing selective ion-implantation in an uppermost superficial portion of the drift layer 2.

In this embodiment, too, the drift layer 2 has a multilayer structure including the low concentration layer 21 and the ultrathin high concentration layer 22. Accordingly, similarly to the embodiment 1, an influence of a lattice constant difference between the substrate 1 and the drift layer 2 (low concentration layer 21) can be mitigated, so that occurrence of a crystal defect is suppressed. Even when a crystal defect occurs, deterioration in the crystal quality of the drift layer 2 due to the crystal defect is suppressed. This prevents decrease in the mobility of carriers in the drift layer 2. Thus, a semiconductor device having a low element resistance is achieved.

A method for determining the thickness of the low concentration layer 21 is similar to that of the embodiment 1. That is, when the total sum of the amount of change in the electric field that is acceptable in the ultrathin high concentration layer 22 is defined as is defined as $\Delta E1$, it suffices that the total sum w of thicknesses of the ultrathin high concentration layers 22 satisfies the aforesaid Expression (3).

Embodiment 3

In the examples shown in the embodiments 1 and 2, the epitaxial wafer 100 is used in which the epitaxial layer 2a (the laminated structure of the low concentration layer 21 and the ultrathin high concentration layer 22) is grown immediately on the substrate 1 as shown in FIG. 2. Instead, in this embodiment, as shown in FIG. 10, an epitaxial wafer 101 having a buffer layer 3 provided between the substrate 1 and the epitaxial layer 2a is used.

Configurations of the substrate 1 and the epitaxial layer 2a are the same as those of the embodiments 1 and 2. The buffer layer 3 is a SiC layer whose doping concentration is set to be a value intermediate between the value of the substrate 1 and the value of the drift layer 2. Since the buffer layer 3 is interposed between the substrate 1 and the drift layer 2, occurrence of a crystal defect due to the lattice constant difference between the substrate 1 and the drift layer 2 can be further reduced.

The buffer layer 3 may have any of a single layer structure in which the doping concentration is uniform, a stepwise graded structure in which the doping concentration is varied stepwise in the thickness direction of the buffer layer, and a continuous graded structure in which the doping concentration is varied continuously in the thickness direction of the buffer layer.

Figure 10:
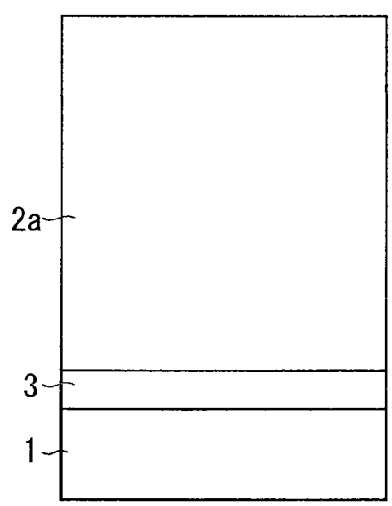
FIG. 10 A diagram showing a configuration of an epitaxial wafer according to an embodiment 3.

FIG. 11 shows an example of a configuration of a Schottky diode that is formed with use of the epitaxial wafer 101 shown in FIG. 10. FIG. 12 shows an example of a configuration of a field effect transistor that is formed with use of the epitaxial wafer 101. The configurations shown in FIG. 11 and FIG. 12 are identical to those of FIG. 1 and FIG. 8, respectively, except that the buffer layer 3 is provided between the substrate 1 and the drift layer 2. Therefore, a detailed description is omitted herein.

In this embodiment, due to a synergistic effect of the drift layer 2 including the ultrathin high concentration layer 22 according to the present invention and the buffer layer 3, the influence of the lattice constant difference between the substrate 1 and the drift layer 2 (low concentration layer 21) can be further mitigated as compared with the embodiments 1 and 2. Thus, occurrence of a crystal defect is suppressed. Additionally, since the drift layer 2 includes the ultrathin high concentration layer 22, the above-mentioned effect can be sufficiently obtained without a much thickness of the buffer layer 3. Accordingly, increase in the element resistance, which may be otherwise caused by providing the buffer layer 3, can be suppressed.

DESCRIPTION OF THE REFERENCE NUMERALS 1 substrate; 2 drift layer; 2a epitaxial layer; 3 buffer layer; 4 guard ring; 5 anode electrode; 6 cathode electrode; 7 body region; 71 contact region; 72 channel formation region; 8 source region; 9 gate insulating film; 10 gate electrode; 11 interlayer insulating film; 12 source electrode; 13 interconnection; 14 drain electrode; 15 channel layer; 21 low concentration layer; 22 ultrathin high concentration layer; 100, 101 epitaxial wafer

The invention claimed is:

1. An epitaxial wafer comprising:
a semiconductor substrate; and
an epitaxial layer provided on said semiconductor substrate, said epitaxial layer being doped with the same dopant as a dopant doped into said semiconductor substrate and including a plurality of low concentration layers and at least one high concentration layer, wherein
a doping concentration of said dopant in said plurality of low concentration layers is lower than that in said semiconductor substrate,
said at least one high concentration layer is arranged between said low concentration layers, and the thickness of said at least one high concentration layer is smaller than that of said low concentration layer, and a doping concentration of said dopant in said at least one high concentration layer is equal to that in said semiconductor substrate, and
said semiconductor substrate and said epitaxial layer are made of silicon carbide and a buffer layer arranged between said semiconductor substrate and said epitaxial layer, a doping concentration of said dopant in said buffer layer being lower than that in said semiconductor substrate and higher than that in said low concentration layer.

2. The epitaxial wafer according to claim 1, wherein a total amount of sheet concentration of said dopant in said at least one high concentration layer is equal to or less than $5.346 \times 10^{12}/cm^2$.

3. The epitaxial wafer according to claim 1, wherein a total sum of thickness of said high concentration layer is 0.5 nm or more and 10 nm or less.

4. A semiconductor device, comprising:
a semiconductor substrate; and
a drift layer provided on said semiconductor substrate and including an epitaxial layer, said drift layer being doped with the same dopant as a dopant doped into said semiconductor substrate and including a plurality of low concentration layers and at least one high concentration layer, wherein
a doping concentration of said dopant in said plurality of low concentration layers is lower than that in said semiconductor substrate,
said at least one high concentration layer is arranged between said low concentration layers, and the thickness of said at least one high concentration layer is smaller than that of said low concentration layer, and a doping concentration of said dopant in said at least one high concentration layer is equal to that in said semiconductor substrate, and
said semiconductor substrate and said epitaxial layer are made of silicon carbide and a buffer layer arranged between said semiconductor substrate and said epitaxial layer, a doping concentration of said dopant in said buffer layer being lower than that in said semiconductor substrate and higher than that in said low concentration layer.

5. The semiconductor device according to claim 4, wherein a total amount of sheet concentration of said dopant in said at least one high concentration layer is equal to or less than $5.346 \times 10^{12}/cm^2$.

6. The semiconductor device according to claim 4, wherein a total sum of thickness of said high concentration layer is 0.5 nm or more and 10 nm or less.

* * * * *